United States Patent
Takahashi et al.

(10) Patent No.: US 7,601,661 B2
(45) Date of Patent: Oct. 13, 2009

(54) INDIUM OXIDE-TIN OXIDE POWDER AND SPUTTERING TARGET USING THE SAME

(75) Inventors: Seiichiro Takahashi, Ageo (JP); Hiroshi Watanabe, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 183 days.

(21) Appl. No.: 10/584,709

(22) PCT Filed: Dec. 24, 2004

(86) PCT No.: PCT/JP2004/019353

§ 371 (c)(1),
(2), (4) Date: Jun. 26, 2006

(87) PCT Pub. No.: WO2005/063628

PCT Pub. Date: Jul. 14, 2005

(65) Prior Publication Data

US 2007/0144900 A1    Jun. 28, 2007

(30) Foreign Application Priority Data

Dec. 25, 2003  (JP) ............................. 2003-431585

(51) Int. Cl.
  *C04B 35/453* (2006.01)
  *C01G 19/02* (2006.01)
(52) U.S. Cl. .................. 501/134; 423/594.9; 252/520.1
(58) Field of Classification Search .................. 501/134; 252/520.1
  See application file for complete search history.

(56) References Cited

U.S. PATENT DOCUMENTS

| | | | | |
|---|---|---|---|---|
| 5,071,800 A | * | 12/1991 | Iwamoto et al. | 501/126 |
| 5,762,768 A | * | 6/1998 | Goy et al. | 204/298.13 |
| 5,866,493 A | * | 2/1999 | Lee et al. | 501/134 |
| 6,030,507 A | * | 2/2000 | Lupton et al. | 204/164 |
| 6,080,341 A | * | 6/2000 | Stenger et al. | 264/6 |
| 6,096,285 A | * | 8/2000 | Hayashi et al. | 423/618 |
| 6,099,982 A | * | 8/2000 | Okabe et al. | 428/697 |
| 6,500,225 B2 | * | 12/2002 | Hasegawa et al. | 75/234 |
| 6,936,100 B2 | * | 8/2005 | Tadakuma | 117/68 |
| 7,115,219 B2 | * | 10/2006 | Hattori et al. | 252/520.1 |
| 7,374,743 B2 | * | 5/2008 | Katusic et al. | 423/618 |

FOREIGN PATENT DOCUMENTS

| | | | |
|---|---|---|---|
| DE | 19822570 | * | 7/1999 |
| JP | 62-21751 | | 1/1987 |
| JP | 63199862 | * | 8/1988 |
| JP | 5-193939 | | 8/1993 |
| JP | 6-191846 | | 7/1994 |
| JP | 8-246140 | | 9/1996 |
| JP | 8-246141 | | 9/1996 |
| JP | 8-246142 | | 9/1996 |
| JP | 9-221322 | | 8/1997 |
| JP | 11-11946 | | 1/1999 |
| JP | 11011946 | * | 1/1999 |
| JP | 2000-281337 | | 10/2000 |
| JP | 2001-172018 | | 6/2001 |
| JP | 2001-261336 | | 9/2001 |
| JP | 2002-68744 | | 3/2002 |

* cited by examiner

*Primary Examiner*—Karl E Group
(74) *Attorney, Agent, or Firm*—Sughrue Mion, PLLC

(57) ABSTRACT

The invention provides an indium oxide-tin oxide powder which can be produced at low cost and which can provide a high-density sputtering target having a prolonged target life, and a sputtering target employing the powder. The indium oxide-tin oxide powder containing an In—Sn oxide as a predominant component is characterized in that the oxide powder contains no compound oxide ($In_4Sn_3O_{12}$) detectable through X-ray diffraction and has a $SnO_2$ solid solution amount in $In_2O_3$ of 2.3 mass % or more, the $SnO_2$ solid solution amount being calculated from the precipitated $SnO_2$ content (mass %) obtained from the ratio between integral diffraction intensity attributed to $In_2O_3$ (222) and integral diffraction intensity attributed to $SnO_2$ (110).

7 Claims, 8 Drawing Sheets

INDIUM OXIDE-TIN OXIDE POWDER AND SPUTTERING TARGET USING THE SAME

TECHNICAL FIELD

The present invention relates to an indium oxide-tin oxide powder, and to a sputtering target using the same.

BACKGROUND ART

Sputtering is a generally known technique for forming thin film. In the sputtering technique, a thin film is formed by sputtering a sputtering target. The sputtering technique is employed in industrial processes, since a thin film of large surface area can be readily formed, and a high-performance film can be formed with high efficiency. In recent years, various sputtering techniques have been known, such as reactive sputtering; i.e., sputtering in a reactive gas, and magnetron sputtering, which realizes high-speed thin film formation by placing a magnet on the backside of a target.

Among thin film products obtained through sputtering, indium oxide-tin oxide ($In_2O_3$—$SnO_2$ compound oxide, hereinafter abbreviated to as ITO) film is a transparent conductive film which has high optical transparency with respect to visible light and high conductivity and which, therefore, finds a wide variety of uses such as for a liquid crystal display, a heat-generating film for defogging a glass panel, and an IR-reflecting film.

Thus, in order to produce thin films at higher efficiency and lower cost, modification and improvement of sputtering conditions and sputtering apparatuses are required and are now under way, and effective operation of sputtering apparatuses is essential. In the production of ITO film through sputtering, the period from setting of a new sputtering target to termination of initial arc (anomalous discharge); i.e., the period required for initiating formation of thin films, is preferably as short as possible, and assessing the sputter-enabling period of a target from the setting thereof (cumulative sputtering time: target life) is a key issue.

The aforementioned sputtering target for forming an ITO film is produced through mixing indium oxide powder and tin oxide powder at a predetermined ratio, molding under dry or wet conditions, and sintering the molded product (Patent Document 1). In this connection, highly-dispersible indium oxide powder has been proposed for producing high-density sintered ITO (see, for example, Patent Documents 2, 3, and 4).

Meanwhile, another known method includes sintering an ITO powder synthesized through the co-precipitation method under wet conditions (see, for example Patent Document 5). Similarly, a variety of wet-synthesis methods for producing ITO powder have been proposed for producing high-density sintered ITO (see, for example, Patent Documents 6 to 9).

Yet another method for producing an ITO powder containing an indium-tin-oxide solid solution phase in an amount of at least 90 vol. % in an indium oxide crystal lattice has been proposed. In the method, an indium-tin alloy is reacted with oxygen in plasma arc, followed by cooling the reaction product at a predetermined cooling rate or faster by means of a gas flow at a Mach number of $\geq 1$ (see Patent Document 10), to thereby attain a predetermined resistivity of a green compact of the ITO powder.

However, even now, there is keen demand for an ITO powder which can readily produce a high-density sintered ITO without rigorously controlling sintering conditions and other conditions, thereby producing a long-life sputtering target.

Patent Document 1: Japanese Patent Application Laid-Open (kokai) No. 62-21751
Patent Document 2: Japanese Patent Application Laid-Open (kokai) No. 5-193939
Patent Document 3: Japanese Patent Application Laid-Open (kokai) No. 6-191846
Patent Document 4: Japanese Patent Application Laid-Open (kokai) No. 2001-261336
Patent Document 5: Japanese Patent Application Laid-Open (kokai) No. 62-21751
Patent Document 6: Japanese Patent Application Laid-Open (kokai) No. 9-221322
Patent Document 7: Japanese Patent Application Laid-Open (kokai) No. 2000-281337
Patent Document 8: Japanese Patent Application Laid-Open (kokai) No. 2001-172018
Patent Document 9: Japanese Patent Application Laid-Open (kokai) No. 2002-68744
Patent Document 10: Japanese Patent Application Laid-Open (kokai) No. 11-11946

DISCLOSURE OF THE INVENTION

Problems to be Solved by the Invention

Under such circumstances, an object of the present invention is to provide an indium oxide-tin oxide powder which can be produced at low cost and which can provide a high-density sputtering target having a prolonged target life. Another object of the invention is to provide a sputtering target employing the powder.

Means For Solving The Problems

In a first mode of the present invention for attaining the aforementioned objects, there is provided an indium oxide-tin oxide powder comprising an In—Sn oxide as a predominant component, characterized in that the oxide powder contains no compound oxide ($In_4Sn_3O_{12}$) detectable through X-ray diffraction and has a $SnO_2$ solid solution amount in $In_2O_3$ of 2.3 mass % or more, the $SnO_2$ solid solution amount being calculated from the ratio between integral diffraction intensity attributed to $In_2O_3$ (222) and integral diffraction intensity attributed to $SnO_2$ (110), and the ratio between $In_2O_3$ content and $SnO_2$ content obtained from an In element concentration and a Sn element concentration through ICP analysis.

According to the first mode, indium oxide contains at least a predetermined amount of tin oxide forming a solid solution. Therefore, the ITO powder has high sinterability. Thus, even when the ITO green compact does not have an increased ITO green density, the sintered sputtering target maintains a high density.

A second mode of the present invention is drawn to a specific embodiment of the indium oxide-tin oxide powder of the first mode, wherein the $SnO_2$ solid solution amount in $In_2O_3$ is 2.4 mass % or more.

According to the second mode, indium oxide contains a large amount of tin oxide forming a solid solution. Therefore, the ITO powder has higher sinterability.

A third mode of the present invention is drawn to a specific embodiment of the indium oxide-tin oxide powder of the first or second mode, which has a tin content of 2.3 to 45 mass % as calculated on the basis of $SnO_2$.

According to the third mode, the tin content is at least 2.3 mass % as calculated on the basis of $SnO_2$, since the $SnO_2$ solid solution amount in $In_2O_3$ is at least 2.3 mass %. When the tin content is in excess of 45 mass %, for example, $SnO_2$ is precipitated in a thin film formed through sputtering the target employing the ITO powder, thereby impeding conductivity of the thin film.

A fourth mode of the present invention is drawn to a specific embodiment of the Indium oxide-tin oxide powder of any of the first to third modes, which is produced through feeding, into an oxidizing atmosphere serving as a heat source, an indium-tin alloy in the form of a liquid stream, liquid droplets, or powder or an ITO powder; and capturing and collecting the formed product in the form of microparticles by means of a fluid.

According to the fourth mode, the indium-tin alloy in the form of a liquid stream, liquid droplets, or powder is fed into an oxidizing atmosphere serving as a heat source, and the formed microparticles are captured and collected by means of a fluid. Therefore, an ITO powder can be produced through a relatively easy process.

A fifth mode of the present invention is drawn to a specific embodiment of the indium oxide-tin oxide powder of the fourth mode, wherein the fluid is a fluid of atomized liquid (hereinafter referred to as atomized liquid fluid).

According to the fifth mode, microparticles can be readily collected by means of an atomized liquid fluid.

A sixth mode of the present invention is drawn to a specific embodiment of the indium oxide-tin oxide powder of the fourth or fifth mode, wherein the formed microparticles flow at a maximum speed of 150 m/sec or less, when the microparticles are captured by means of the liquid fluid.

According to the sixth mode, microparticles can be cooled and collected at a comparatively slow speed. Therefore, an ITO powder can be produced through a relatively easy process.

In a seventh mode of the present invention, there is provided a sputtering target characterized by being produced through sintering an indium oxide-tin oxide powder as recited in any of the first to sixth modes.

According to the seventh mode, a sputtering target can be produced from an ITO powder having high sinterability.

Effects Of The Invention

As described hereinabove, the ITO powder of the present invention contains no compound oxide ($In_4Sn_3O_{12}$) detectable through X-ray diffraction and has a $SnO_2$ solid solution amount in $In_2O_3$ of 2.3 mass % or more, the $SnO_2$ solid solution amount being calculated from the ratio between integral diffraction intensity attributed to $In_2O_3$ (222) and integral diffraction intensity attributed to $SnO_2$ (110), and the ratio between $In_2O_3$ content and $SnO_2$ content obtained from an In element concentration and a Sn element concentration through ICP analysis. Therefore, the ITO powder has high sinterability and can readily produce a high-density sputtering target even when the green compact of the powder does not have an increased green density.

BEST MODES FOR CARRYING OUT THE INVENTION

Figure 1:
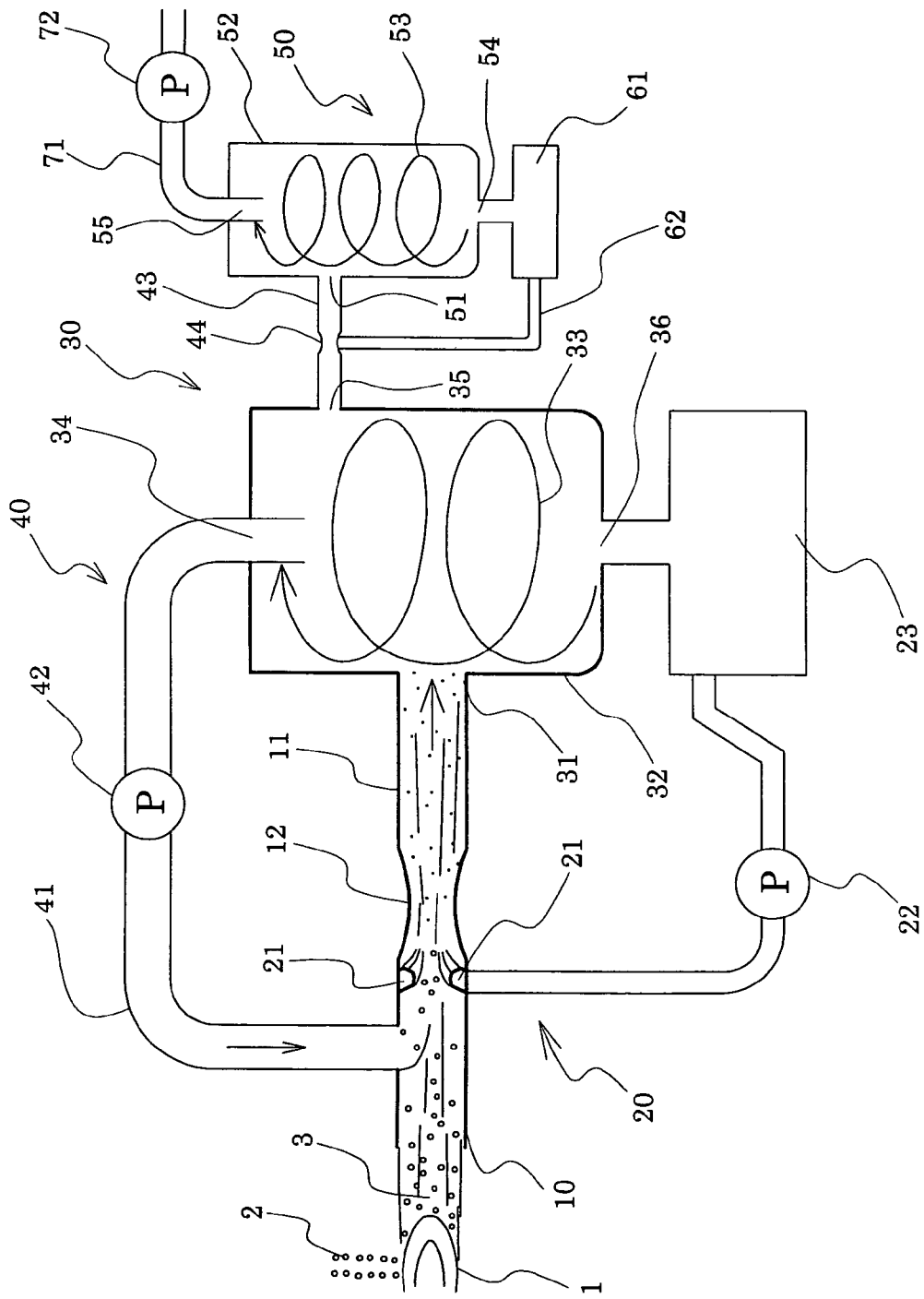
FIG. 1 Schematic configuration of an embodiment of the apparatus for producing microparticles for forming the ITO powder of the present invention.
Figure 2:
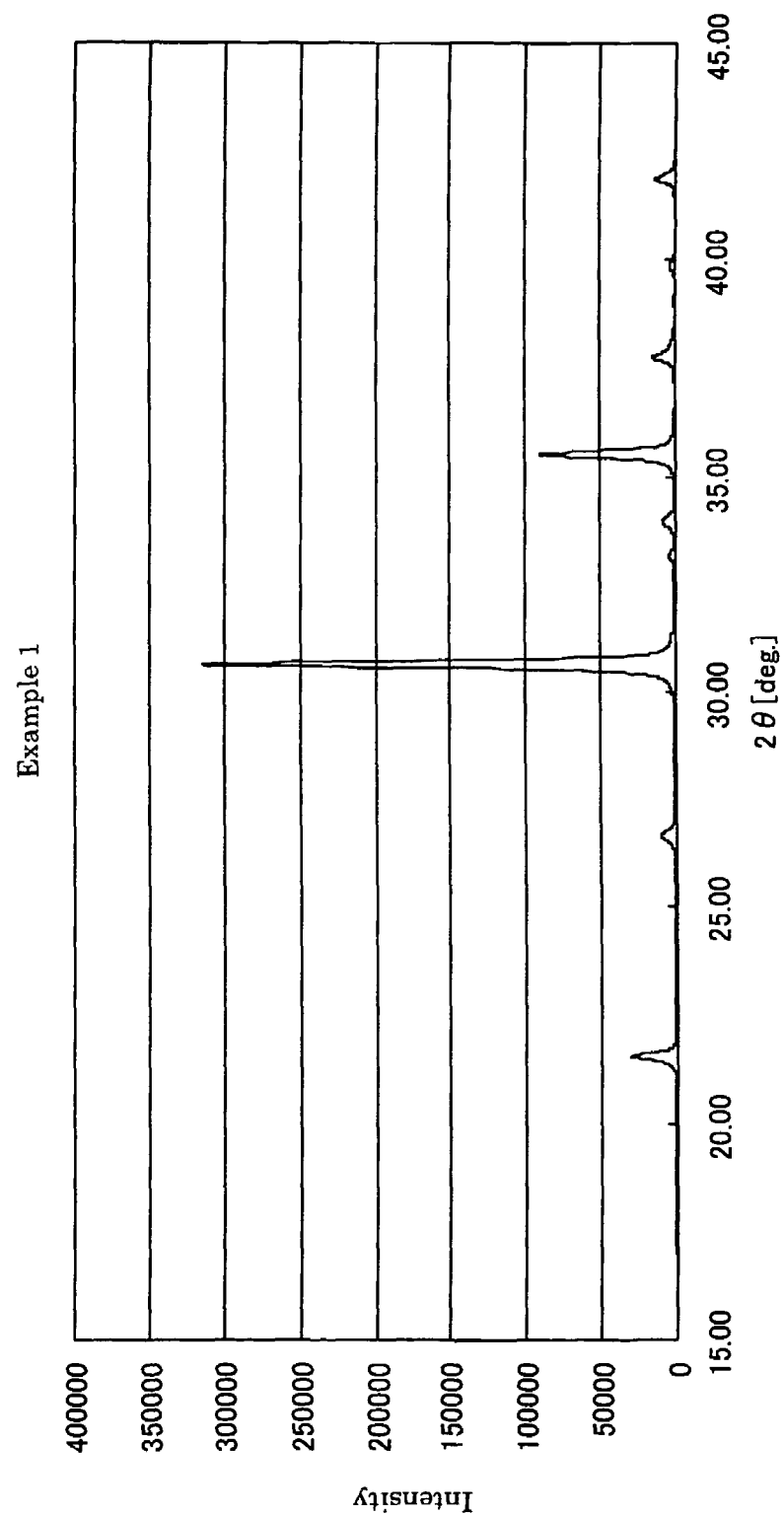
FIG. 2 An X-ray diffraction chart of ITO powder produced in Example 1 of the present invention.
Figure 3:
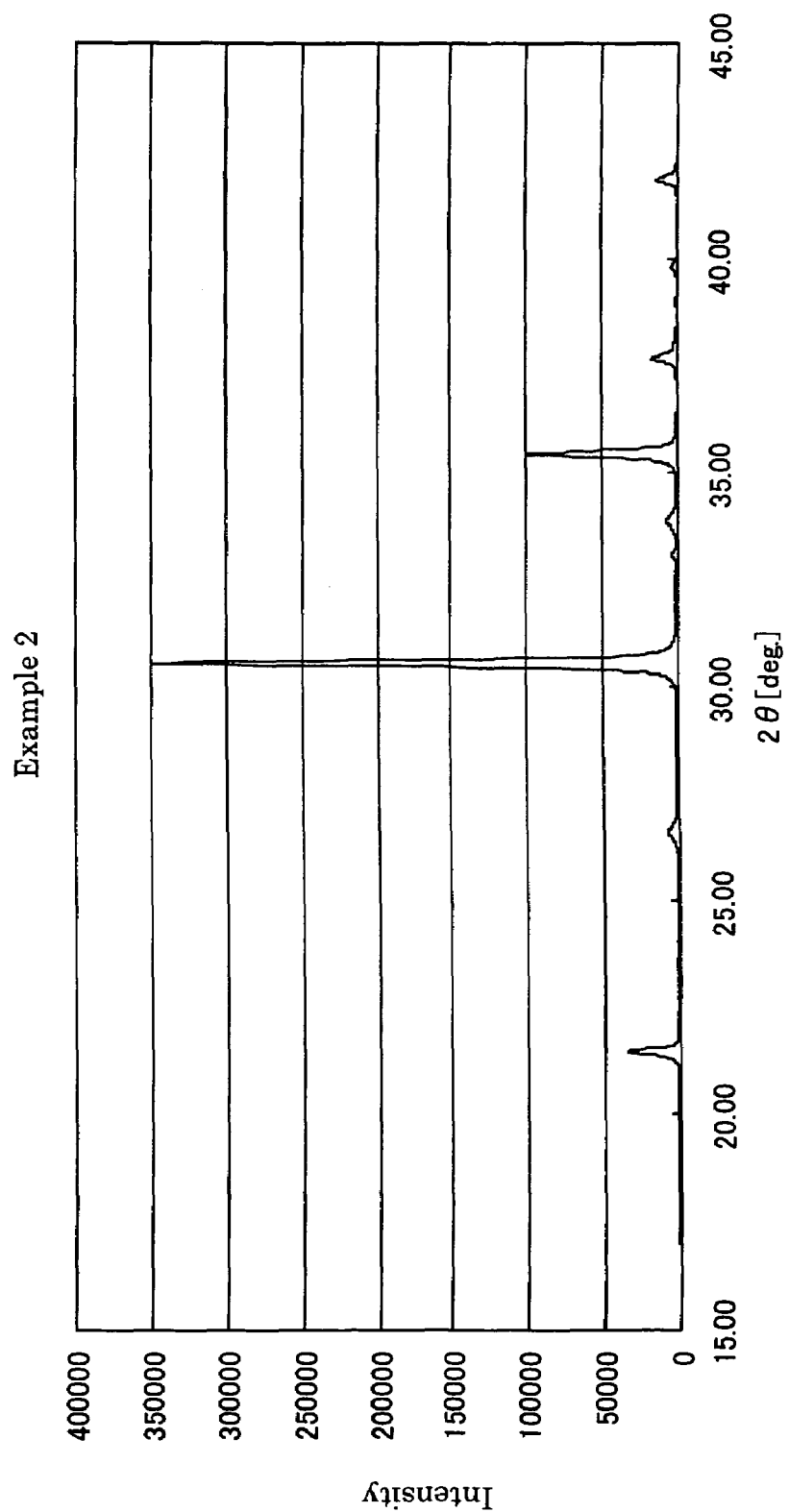
FIG. 3 An X-ray diffraction chart of ITO powder produced in Example 2 of the present invention.
Figure 4:
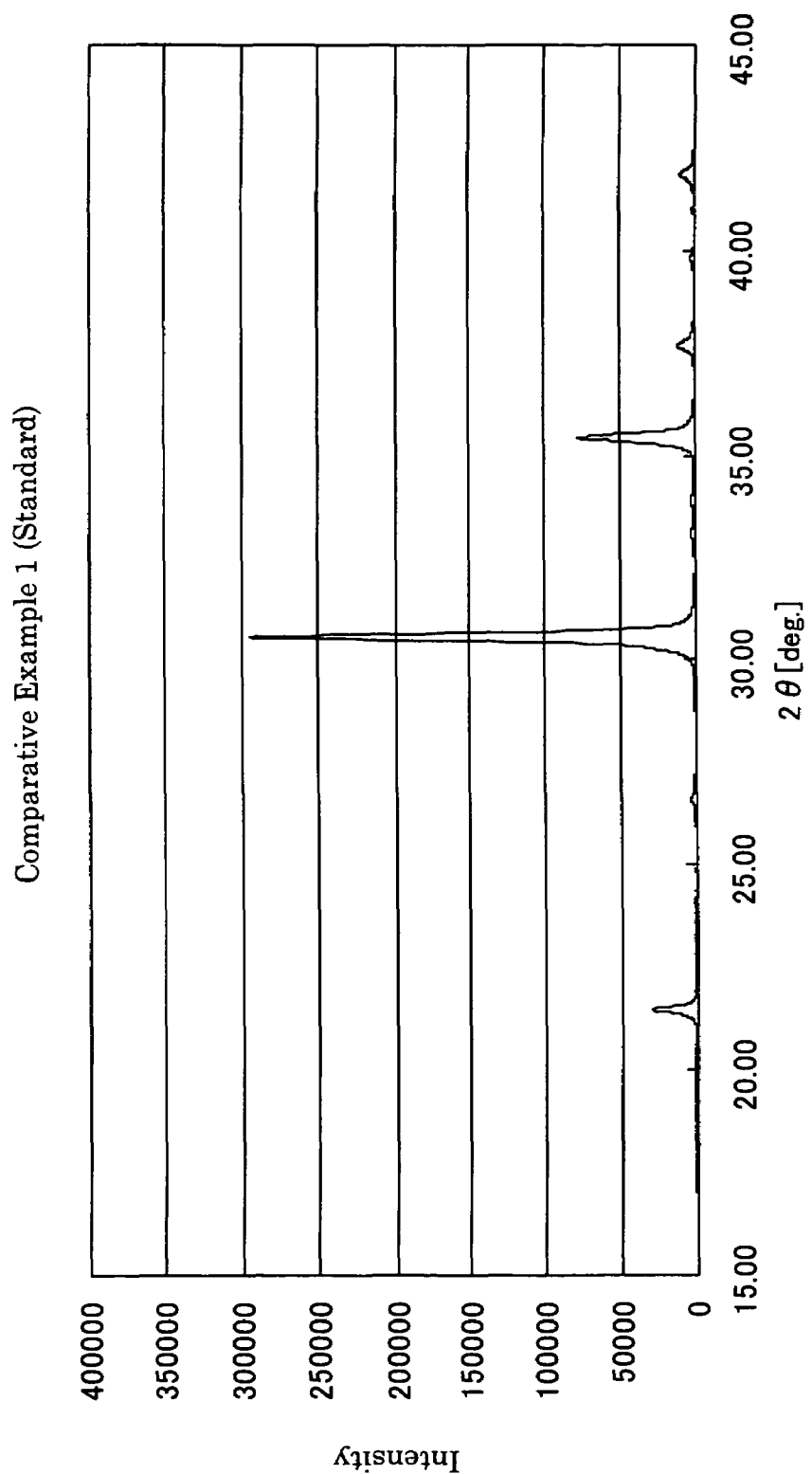
FIG. 4 An X-ray diffraction chart of ITO powder produced in Comparative Example 1 of the present invention.
Figure 5:
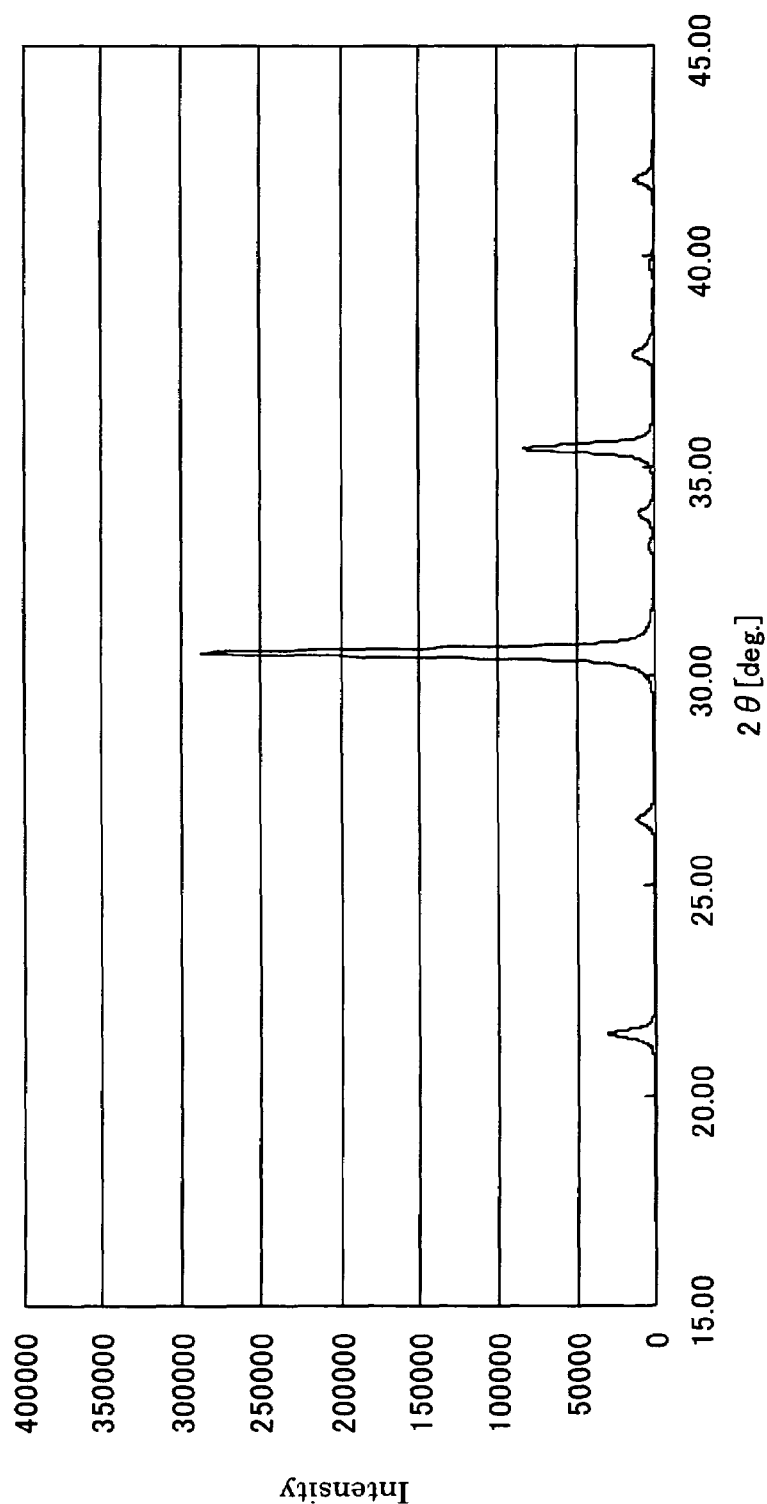
FIG. 5 An X-ray diffraction chart of ITO powder produced in Comparative Example 2 of the present invention.
Figure 6:
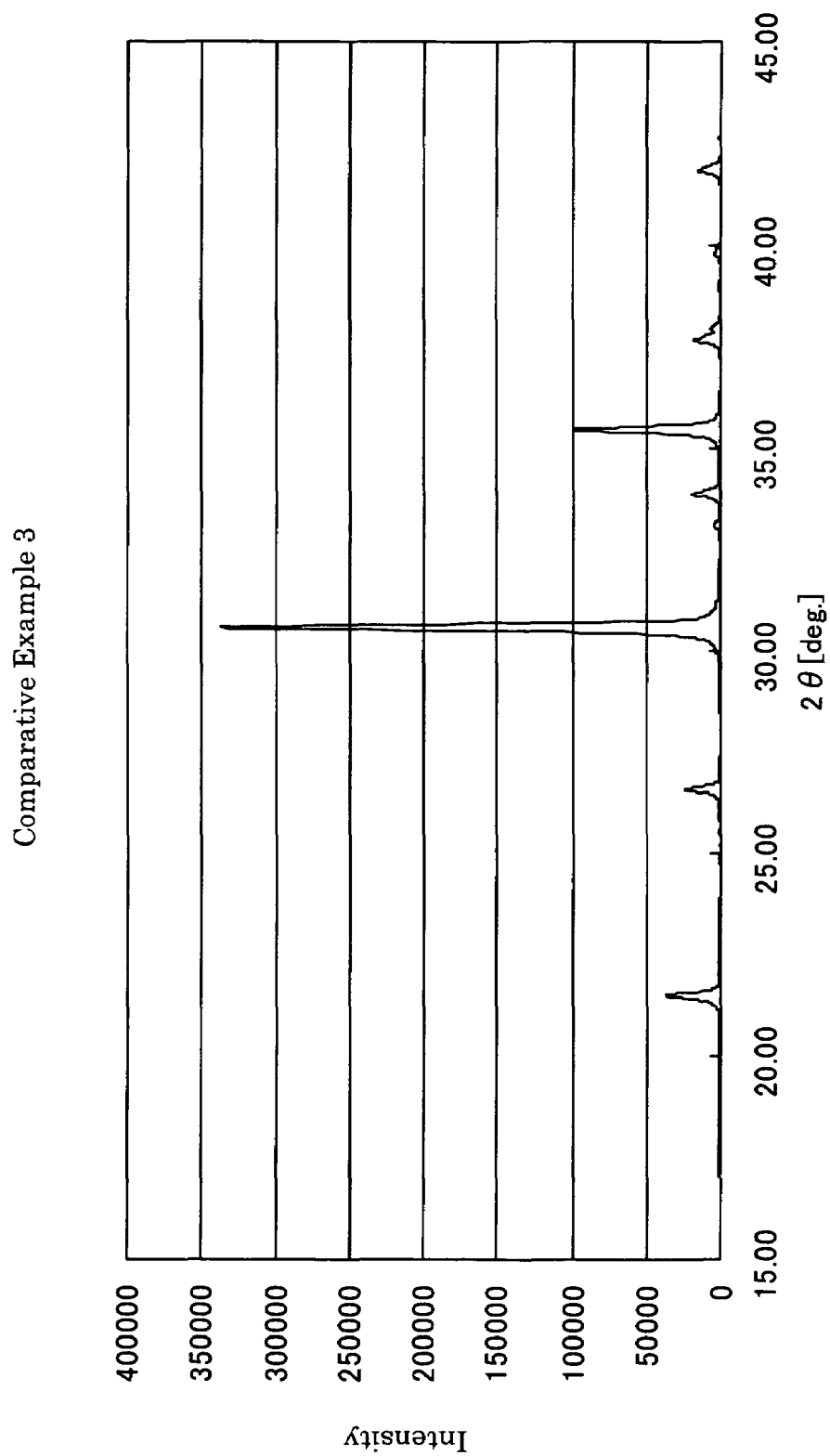
FIG. 6 An X-ray diffraction chart of ITO powder produced in Comparative Example 3 of the present invention.

The ITO powder of the present invention is an indium oxide-tin oxide powder containing an In—Sn oxide as a predominant component, which contains no compound oxide ($In_4Sn_3O_{12}$) detectable through X-ray diffraction. Compound oxide ($In_4Sn_{13}O_{12}$) is detected in the following ITO powders: an ITO powder obtained through pulverizing a product formed through sintering an ITO powder at 1,250° C. or higher and an ITO powder obtained through pulverizing a product formed through sintering a mixture of indium oxide powder and tin oxide powder. Needless to say, such powders do not fall within the scope of the invention.

In addition, the ITO powder of the present invention has a $SnO_2$ solid solution amount in $In_2O_3$ of 2.3 mass % or more, preferably 2.4 mass % or more, the $SnO_2$ solid solution amount being calculated from the ratio between integral diffraction intensity attributed to $In_2O_3$ (222) and integral diffraction intensity attributed to $SnO_2$ (110), and the ratio between $In_2O_3$ content and $SnO_2$ content obtained from an In element concentration and a Sn element concentration through ICP analysis. The "$SnO_2$ solid solution amount" as used herein may be derived from the ratio between integral diffraction intensity attributed to $In_2O_3$ (222) and integral diffraction intensity attributed to $SnO_2$ (110), and the ratio between $In_2O_3$ content and $SnO_2$ content obtained from an In element concentration and a Sn element concentration through an analysis such as analysis of a molten product or inductively coupled plasma spectroscopic analysis (ICP spectroscopic analysis), through calculating the difference between the two ratios. In the present invention, the $SnO_2$ solid solution amount is defined as being calculated from the ratio between integral diffraction intensity attributed to $In_2O_3$ (222) and integral diffraction intensity attributed to $SnO_2$ (110), and the ratio between $In_2O_3$ content and $SnO_2$ content obtained from an In element concentration and a Sn element concentration through ICP analysis.

When the $SnO_2$ solid solution amount in $In_2O_3$ is 2.3 mass % or more, preferably 2.4 mass % or more, the ITO powder has higher sinterability as compared with a conventional ITO powder obtained through wet synthesis. Thus, the ITO powder of the invention can produce high-density sintered ITO.

The aforementioned Patent Document 10 discloses that the amount of indium-tin-oxide solid solution phase in a crystal lattice of indium oxide is at least 90 vol. %. However, in the present invention, the amount of tin oxide dissolved in indium oxide is employed instead of the amount of indium-tin-oxide solid solution phase in a crystal lattice of indium oxide.

The ITO powder of the present invention contains a large amount of a $SnO_2$ solid solution component dissolved in $In_2O_3$. Therefore, the ITO powder exhibits high sinterability and readily provides high-density sintered ITO. As a result, a long-life sputtering target can be produced.

The ITO powder of the present invention has a tin content of 2.3 to 45 mass % as calculated on the basis of $SnO_2$. Since the $SnO_2$ solid solution amount in $In_2O_3$ is at least 2.3 mass %, the tin content is at least 2.3 mass % as calculated on the basis of $SnO_2$. In contrast, when the tin content is in excess of 45 mass %, for example, $SnO_2$ is precipitated in a thin film formed through sputtering the target employing the ITO powder, thereby impeding conductivity of the thin film. Needless to say, both cases are not preferred.

No particular limitation is imposed on the process for producing the ITO powder of the present invention, so long as ITO powders satisfying the aforementioned properties are produced. However, the ITO powder of the present invention can readily be produced at low cost through dry synthesis. Specifically, the ITO powder may be produced through feeding, into an oxidizing atmosphere serving as a heat source (e.g., acetylene flame or DC plasma flame), an In—Sn alloy in the form of a liquid stream, liquid droplets, or powder or an ITO powder; and collecting the formed ITO microparticles. The In—Sn alloy in the form of a liquid stream or liquid droplets may be obtained through continuously or intermittently pouring the molten alloy dropwise from a tank, and the In—Sn alloy powder may be produced through, for example, atomizing. Furthermore, ITO powders that have been produced through various other methods, or an ITO powder obtained through pulverizing sintered ITO may also be employed as raw material. The thus-produced ITO micropowder may be collected in a dry process by means of a bag filter or an electrostatic precipitator. Alternatively, a wet process may also be employed. That is, water is jetted to the ITO micropowder, to thereby capture the powder, and the mixture is subjected to gas-liquid separation by means of a cyclone separator, to thereby collect the powder in the form of slurry.

When a dry collection process or a wet collection process is employed, spray cooling by means of a high-speed gas flow at a Mach number of $\geq 1$ (as disclosed in Patent Document 10) is not necessarily performed. The microparticles may flow at a maximum speed of 150 m/sec or less, preferably 100 m/sec or less, when the formed microparticles are captured by means of the liquid fluid. In the case where the microparticles are captured at approximately the above flow speed for quenching, the $SnO_2$ solid solution amount in $In_2O_3$ increases as compared with the case of a conventional wet synthesis method, thereby producing an ITO powder having an increased sinterability. In addition, even when an ITO powder containing a compound oxide ($In_4Sn_3O_{12}$) is employed as a raw material, an ITO powder containing no compound oxide ($In_4Sn_3O_{12}$) and having a $SnO_2$ solid solution amount of 2.3 mass % or more, preferably 2.4 mass % or more, can be produced.

However, the Examples as described hereinbelow indicate that the $SnO_2$ solid solution amount varies with respect to the oxygen content of the oxidizing atmosphere serving as a heat source, cooling conditions, and other conditions, and that the ITO powder collected through a wet method has a higher $SnO_2$ solid solution amount as compared with that collected through a dry method.

The ITO powder of the present invention is molded through a dry or wet method, and the formed green compact is sintered, to thereby produce sintered ITO. Since the ITO powder of the invention has high sinterability, high-density sintered ITO can be produced. Furthermore, high-density sintered ITO can be produced, even when the green density of the green compact is not considerably increased.

No particular limitation is imposed on the particle size and particle size distribution of the ITO powder of the present invention. However, in order to produce high-density ITO, the ITO powder preferably has a specific surface area (BET) of 1 to 15 $m^2/g$, particularly preferably 3 to 10 $m^2/g$.

The method for producing the ITO powder of the present invention will next be described.

The ITO powder of the present invention may be produced through feeding, into an oxidizing atmosphere serving as a heat source, an indium-tin alloy in the form of a liquid stream, liquid droplets, or powder or an ITO powder; and capturing and collecting the formed product in the form of microparticles by means of a fluid.

According to the above production method, an In—Sn alloy in the form of a liquid stream, liquid droplets, or powder or an ITO powder is fed into an oxidizing atmosphere serving as a heat source. A molten In—Sn alloy may be continuously poured from a tank so as to form a liquid stream or liquid droplets thereof, or the raw material to be fed may be formed into atomized powder. Alternatively, an ITO powder may be fed.

Examples of the oxidizing atmosphere serving as a heat source include acetylene flame and DC plasma flame. No particular limitation is imposed on the temperature of the heat source, so long as the heat source can melt indium-tin alloy or ITO powder and can sufficiently oxidize the raw material. Conceivably, the temperature is at least some thousands of degrees Celsius in the case of acetylene flame, and at least some ten-thousands of degrees Celsius in the case of DC plasma flame. When a raw material in the form of a liquid stream, liquid droplets, or powder is fed into the above acetylene flame or DC plasma flame, a gas flow of a raw material itself or the corresponding oxide is yielded as a product.

According to the method, the formed product is captured by means of a fluid. Specifically, there may be employed a dry collection method in which the formed microparticles are collected along with the gas flow by means of a bag filter or similar means. Through employment of the method, the ITO powder formed by the mediation of the heat source is quenched by the gas flow, and the formed microparticles are collected.

Alternatively, the formed product may be captured by means of an atomized liquid fluid. Specifically, an atomized liquid fluid, preferably atomized water, is jetted to the product carried by a jet generated from the acetylene flame or DC plasma flame. By the mediation of the atomized liquid fluid, the product is quenched to form microparticles, and a slurry containing the microparticles in the jetted liquid is produced. No particular limitation is imposed on the type of the atomized liquid fluid to be fed, so long as the fluid can capture and cool the product. For example, when water is employed, water (preferably pure water) at ambient temperature is used. Alternatively, chilled water may also be used. The liquid fluid containing the microparticles captured by means of the jetted liquid fluid is subjected to gas-liquid separation, whereby the microparticles are collected in the form of slurry. No particular limitation is imposed on the method of collecting the slurry, and a cyclone separator is preferably employed.

When the aforementioned wet collection method employing such a liquid fluid is employed, the ITO powder microparticles can be collected more easily as compared with the dry collection method. In addition, since the cooling state in the wet collection method is conceivably different from that in the dry collection method, the Sn solid solution amount increases as compared with the dry collection method.

In any case, the product flows at a maximum speed of, for example, 150 m/sec or less, preferably about 100 m/sec or less, when the product is captured in the form of microparticles.

In the above production method, when an In—Sn alloy or ITO powder is employed as a raw material, an indium oxide-tin oxide (ITO) powder can be produced. Such an ITO powder may be employed for producing an ITO sputtering target. The ITO sputtering target material preferably has a tin content, as calculated on the basis of $SnO_2$, of 2.3 to 45 mass %.

An embodiment of the apparatus for producing microparticles of the present invention will next be described with reference to FIG. 1.

The apparatus has an inlet 10 for introducing, into the inside of the apparatus, a gas fluid and a product 3 obtained through feeding of a raw material 2 in the form of a liquid flow, liquid droplets, or powder into a flame 1 (acetylene flame or DC plasma flame) serving as a heat source that can provide an oxidizing atmosphere; fluid jetting means 20 for jetting an atomized liquid fluid to the introduced microparticles; a cyclone separator 30 serving as gas-liquid separation means for subjecting, to gas-liquid separation, the microparticles captured by the liquid fluid, to thereby form a slurry of the microparticles; and circulating means 40 for returning a part of an atmosphere fluid containing microparticles that have not been captured by the liquid fluid to a position where the fluid jetting means is disposed.

No particular limitation is imposed on the type of the inlet 10, so long as the inlet allows a gas flow containing a product to feed into the inside of the apparatus. The inlet may be gas-suction means.

The fluid jetting means 20 is provided in a conduit 11 on the downstream side of the inlet 10. The fluid jetting means 20 includes, for example, a plurality of jet nozzles 21 for jetting water, a pump 22 for feeding fluid to the jet nozzles 21, and a fluid tank 23 for storing fluid. No particular limitation is imposed on the jetting direction of the fluid jetted through the jet nozzles 21. However, the jetting direction is preferably such that the jetted fluid is merged with a gas flow introduced through the inlet 10. The product 3 contained in the gas fluid introduced through the inlet 10 is cooled by means of the atomized liquid fluid (e.g., water) to form microparticles, and the microparticles are captured. In the conduit 11, a venturi section 12, where the flow path is narrowed, is provided on the downstream side of the jet nozzles 21, so as to prevent reduction in flow rate of a gas-liquid mixture. Provision of the venturi section 12 is not obligatory. The jet nozzles 21 and the pump 22 are not necessarily provided, and instead, the liquid may be jetted on the basis of suction power generated by flow of gas.

The conduit 11 provided with the inlet 10 is in communication with an inlet 31 of the cyclone separator 30 serving as gas-liquid separation means. A gas-liquid mixture which has been introduced through the inlet 31 into the cyclone separator 30 forms a vortex 33 proceeding around the inner wall of a cyclone body 32, whereby a liquid component is separated from the gas. The liquid component; i.e., a slurry containing the microparticles, falls down in the cyclone separator 30, and a gas component is discharged through a gas-discharge outlet 34.

In the apparatus of the embodiment, the circulating means 40 is provided so as to communicate with the gas-discharge outlet 34. In other words, circulation piping 41 is connected to the outlet 34, the circulation piping 41 being in communication with a position near the inlet 10 of the conduit 11. A blower 42 intervenes in the circulation piping 41. The circulation means 40 consists of the members 41 and 42. Through the circulation means 40, the powder which has not been captured is returned to the upstream side of the jet nozzles 21, thereby enhancing capturing efficiency.

The liquid component which has been separated from the gas by means of the cyclone separator 30 is discharged through a water-discharge outlet 36 and stored in the fluid tank 23. The supernatant water of the slurry stored in the tank 23 is circulated by means of the circulation means 40, whereby the concentration of the slurry containing the microparticles gradually increases. In order to more effectively circulate the supernatant by means of the circulation means 40, the fluid tank 23 may be provided with a filter for separating microparticles from the liquid or with a settling tank for settling the microparticles through neutralization with an alkali for separation.

Most of the discharged gas produced by means of the cyclone separator 30 is circulated through the gas-discharge outlet 34 to the circulation piping 41. A part of the discharged gas; for example, about 1/10 of the amount of the discharge gas, is discharged through a second gas-discharge outlet 35.

In the apparatus of the present embodiment, a second cyclone separator 50 serving as second gas-liquid separation means is connected to the second gas-discharge outlet 35 via discharge piping 43. The second cyclone separator 50 has virtually the same structure as the cyclone separator 30 and serves as gas-liquid separation means. Specifically, a gas-liquid mixture which has been introduced through an inlet 51 connected to the discharge piping 43 into the second cyclone separator 50 forms a vortex 53 proceeding around the inner wall of a cyclone body 52, whereby a liquid component is separated from the gas. The liquid component; i.e., a slurry containing the microparticles, falls down in the cyclone separator 50, and is discharged through a water-discharge outlet 54 and stored in a fluid tank 61. The gas component is discharged through a gas-discharge outlet 55. More specifically, a venturi section 44, where the flow path is narrowed, intervenes in the discharge piping 43, and water circulating piping 62 is provided so as to maintain communication between the venturi section 44 and the fluid tank 61. When high-speed gas flow is provided in the venturi section 44, water contained in the fluid tank 61 is drawn and jetted into the venturi section 44, whereby microparticles remaining in the gas phase are captured by water (liquid). Gas-discharge piping 71 is connected to the gas-discharge outlet 55, and a second blower 72 is provided in the gas-discharge piping 71, such that the gas is discharged through the gas-discharge outlet 55 by the mediation of the second blower 72. Water contained in the water tank 61 may be jetted into the gas-discharge piping 43 by means of a pump and jet nozzles as mentioned in relation to the cyclone separator 30. As also mentioned above, the fluid tank 61 may be provided with a filter and a settling tank for separating microparticles from the liquid through neutralization. In addition, a portion of the gas discharged through the gas-discharge outlet 55 may be circulated to the upstream side of the venturi section 44 of the gas-discharge piping 43, to thereby enhance capturing efficiency.

When the cyclone separator 30 provides sufficient microparticle-capturing efficiency, the second cyclone separator 50 is not necessarily provided. In order to further enhance capturing efficiency, a plurality of cyclone separators may be linked together.

The ITO powder of the present invention as described hereinabove is suitable for a raw material for producing sputtering targets.

An exemplary process for producing a sputtering target from the ITO powder of the present invention will next be described.

Firstly, the ITO powder serving as a raw material is molded through any of conventionally known wet methods and dry methods, the thus-yielded green compact is fired.

Examples of the dry methods include cold pressing and hot pressing. According to cold pressing, ITO powder is charged into a mold, and the molded product is fired/sintered in air or an oxygen atmosphere. According to hot pressing, ITO powder is directly sintered in a mold.

Examples of preferred wet methods include a filtration molding method (see Japanese Patent Application Laid-Open (kokai) No. 11-286002). The filtration molding method employs a filtration mold, formed of a water-insoluble material, for removing water under reduced pressure from a ceramic raw material slurry, to thereby yield a green compact, the filtration mold comprising a lower mold having one or more water-discharge holes; a water-passing filter for placement on the lower mold; a seal material for sealing the filter; and a mold frame for securing the filter from the upper side through intervention of the seal material. The lower mold, mold frame, seal material, and filter, which can be separated from one another, are assembled to thereby form the filtration mold. According to the filtration molding method, water is removed under reduced pressure from the slurry only from the filter side. In a specific operation making use of the filtration mold, a ceramic powder mixture, ion-exchange water, and an organic additive are mixed, to thereby prepare a slurry, and the slurry is poured into the filtration mold. Water contained in the slurry is removed under reduced pressure from only the filter side, whereby a green compact is yielded. The resultant ceramic compact is dried, debindered, and fired.

In the above methods, in the case where an ITO target is produced, the firing temperature is preferably 1,300 to 1,600° C., more preferably 1,450 to 1,600° C. After firing, the fired compact is mechanically worked so as to form a target having predetermined dimensions.

Generally, a surface of the green compact is ground so as to adjust the thickness thereof and polished at several times so as to provide a smooth surface. However, in a preferred mode, the green compact is subjected to a predetermined surface treatment so as to remove micro-cracks.

EXAMPLES

The present invention will next be described in detail by way of examples, which should not be construed as limiting the invention thereto.

Example 1

An atomized powder (mean particle size: 45 μm) of In—Sn alloy (Sn: 9.6 wt. %) was introduced to acetylene flame, to thereby synthesize an ITO ($In_2O_3$:$SnO_2$=90:10 wt. %) powder under dry conditions. The powder was collected by means of a bag filter under dry conditions, to thereby yield an ITO powder of Example 1.

Example 2

In a manner similar to that of Example 1, an ITO powder was synthesized by means of acetylene flame under dry conditions. The powder was collected by jetting water to the powder under wet conditions, to thereby yield an ITO powder of Example 2.

Comparative Example 1

An indium oxide powder which had been synthesized under wet conditions was calcined at 1,000° C. Similarly, a tin oxide powder which had been synthesized under wet conditions was calcined at 1,000° C. The thus-calcined indium oxide powder (90 mass %) and tin oxide powder (10 mass %) were mixed by means of a mortar, to thereby yield an oxide powder of Comparative Example 1 (Standard Product 1).

Comparative Example 2

An ITO powder was synthesized through co-precipitation under wet conditions, to thereby yield an ITO powder of Comparative Example 2.

The co-precipitation wet synthesis was performed through the following procedure. Firstly, In (4N) (20 g) was dissolved in nitric acid (special-grade reagent, concentration: 60 to 61%) (133 cc) at ambient temperature, to thereby obtain a solution (pH=−1.5). Similarly, Sn (4N) (2.12 g) was dissolved in hydrochloric acid (special-grade reagent, concentration: 35 to 36%) (100 cc) at ambient temperature, to thereby obtain a solution (pH=−1.9). The two solutions were mixed, to thereby obtain a mixed-acid solution. No precipitation was observed during mixing, and the mixed solution was found to have a pH of −1.5. Subsequently, 25% aqueous ammonia (special-grade reagent) was added to the acidic solution for neutralization, to thereby adjust the pH to 6.5, whereby a white matter was precipitated. Several hours after, the supernatant was removed, and the precipitate was washed with pure water (2L×3), followed by drying at 80° C., roasting at 600° C. for three hours, and dehydration, to thereby yield an ITO powder through wet synthesis.

Comparative Example 3

A mixture (tin oxide content: 10 wt. %) of an indium oxide powder and a tin oxide powder which had been synthesized under wet conditions was sintered at 1,550° C. or higher. The sintered ITO was pulverized, to thereby yield an ITO powder of Comparative Example 3.

Test Example 1

Each of the ITO powders of Examples 1 and 2 and Comparative Examples 1 to 3 was analyzed in terms of $SnO_2$ solid solution content. The determination procedure was as follows. Prior to the test, ITO powders of Examples 1 and 2 and Comparative Examples 2 and 3 were calcined at 1,000° C. for three hours in air so as to grow precipitated $SnO_2$ microparticles to $SnO_2$ large particles, which are readily detectable.

1. Inductively coupled high-frequency plasma spectroscopic analysis (ICP spectroscopic analysis) was performed. For calculation, it was assumed that each ITO powder exclusively consists of In, Sn, and oxygen (O), and that a certain amount of oxygen may be deficient. The ratio of In to Sn was calculated from the analytical values, and the ratio by weight of $In_2O_3$ to $SnO_2$ was calculated, under the condition that all elemental In and Sn were converted to $In_2O_3$ and $SnO_2$, respectively.

2. ITO powders of Examples 1 and 2 and Comparative Examples 1 to 3 were subjected to powder X-ray diffractometry (XRD: by means of MXP 18II, product of Mac Science), whereby the precipitated $SnO_2$ content of each powder was determined. In each case, the presence of a compound oxide ($In_4Sn_3O_{12}$) was checked from the corresponding diffraction chart. When the compound oxide was not detected, the precipitated $SnO_2$ content (mass %) of the ITO powder was determined from the ratio between the integral diffraction intensity attributed to $In_2O_3$ (222) and the integral diffraction intensity attributed to $SnO_2$ (110), with respect to Standard Product 1 of Comparative Example 1. Specifically, the precipitated $SnO_2$ content (mass %) is a $SnO_2$ content obtained from an integral intensity of X-ray diffraction attributed to $SnO_2$, assuming that the $SnO_2$ component which has not been dissolved in $In_2O_3$ and has been grown through calcination at about 1,000° C. exhibits an X-ray diffraction peak attributed to $SnO_2$ (110). FIGS. 2 to 6 show the results of X-ray diffraction analysis.

3. On the basis of the results of "1." and "2.," the $SnO_2$ solid solution (in $In_2O_3$) content of each ITO powder was obtained from the amount of $SnO_2$ which had been detected through ICP analysis but which had not been detected as $SnO_2$ (110) through X-ray diffraction.

The results are shown in Table 1.

The ITO powders of Examples 1 and 2 were found to have a $SnO_2$ solid solution content of 2.35 wt. % and 2.42 wt. %, which are higher than the $SnO_2$ solid solution content of 2.26 wt. % of the ITO powder of Comparative Example 2 obtained through wet synthesis. The ITO powder of Comparative Example 3, which had been produced through pulverizing the sintered product thereof, was found to form a compound oxide. Therefore, the $SnO_2$ solid solution content of the ITO powder of Comparative Example 3 could not be determined.

mortar, to thereby yield an oxide powder of Comparative Example 4 (Standard Product 2).

Test Example 2

Figure 7:
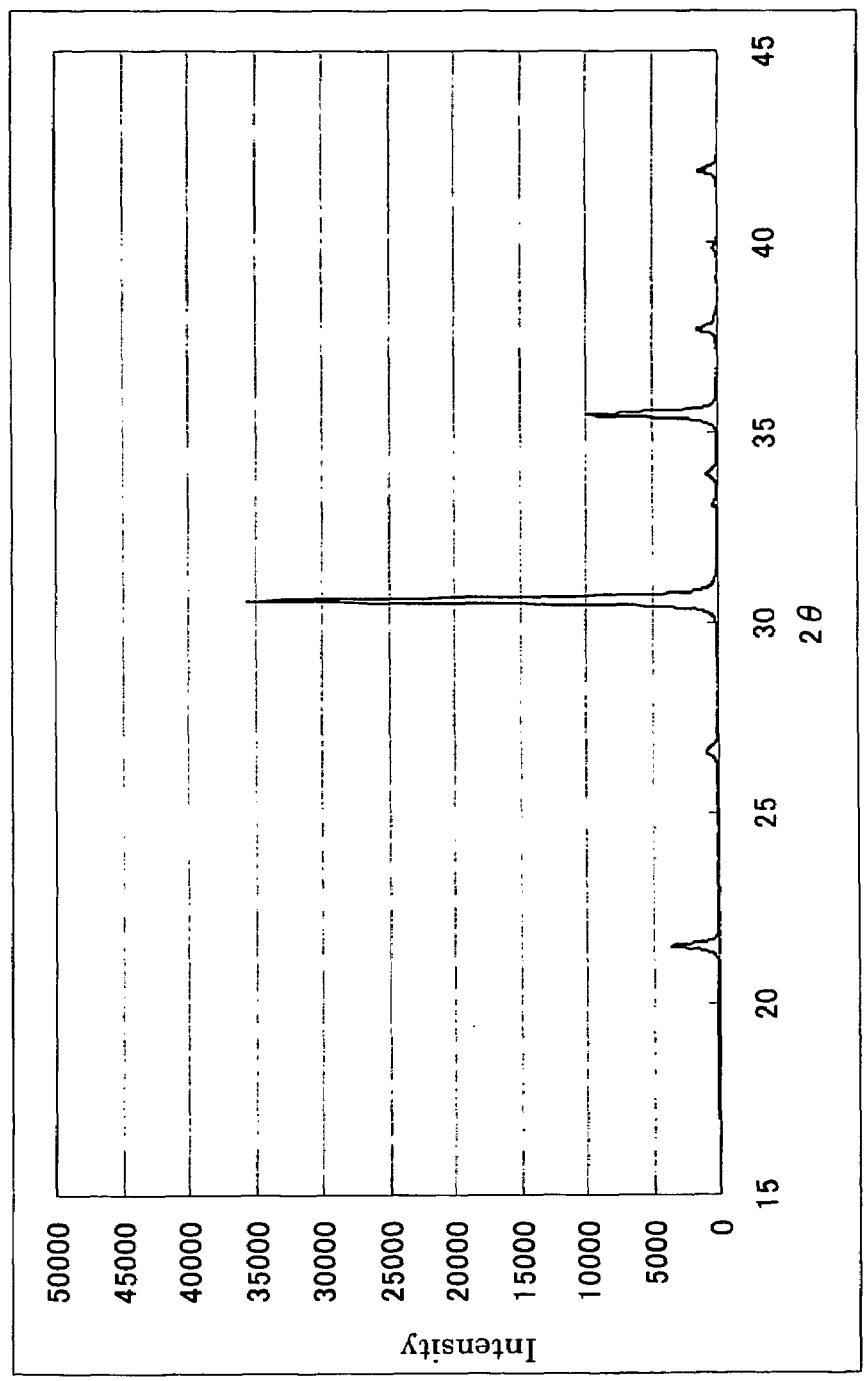
FIG. 7 An X-ray diffraction chart of ITO powder produced in Example 3 of the present invention.
Figure 8:
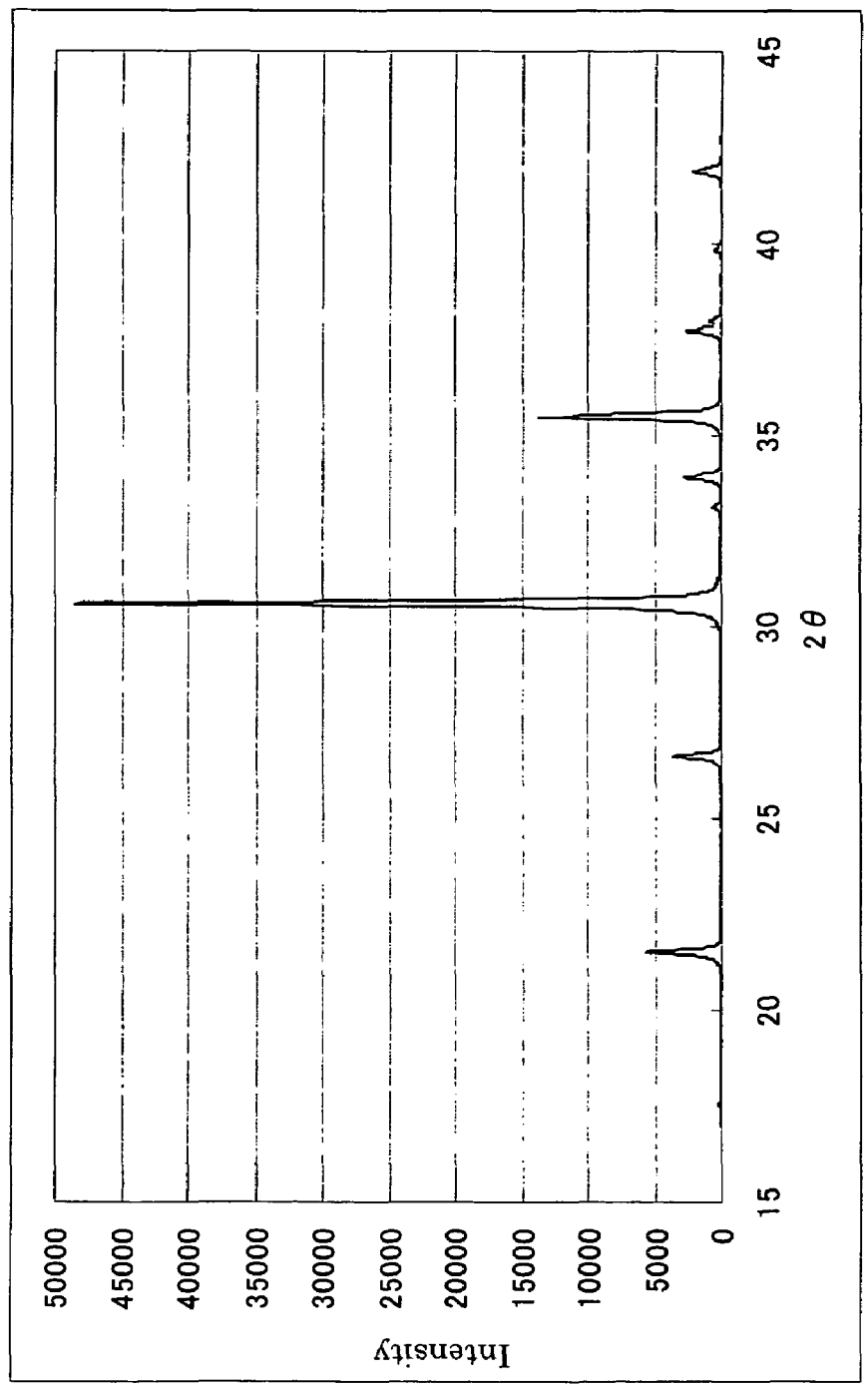
FIG. 8 An X-ray diffraction chart of ITO powder produced in Comparative Example 4 of the present invention.

Similar to Test Example 1, each of the ITO powders of Example 3 and Comparative Example 4 was analyzed in terms of $SnO_2$ solid solution content. Powder X-ray diffractometry (XRD) was performed by means of X'PertPRO MPD (product of Spectris Co., Ltd.). The results are shown in Table 2. FIGS. 7 and 8 show the results of X-ray diffraction analysis.

TABLE 1

| | ICP analysis | | | | XRD analysis | | | $SnO_2$ solid |
|---|---|---|---|---|---|---|---|---|
| | | | | | | | Precipitated | solution |
| Sample No. | In (wt. %) | Sn (wt. %) | $In_2O_3$ (wt. %) | $SnO_2$ (wt. %) | Compound oxide | $InO_3$ (222) | $SnO_2$ (110) | $SnO_2$ content (wt. %) | content (wt. %) |
| Ex. 1 | 74.1 | 8.26 | 89.52 | 10.48 | no | 6974596 | 357821 | 8.13 | 2.35 |
| Ex. 2 | 74.8 | 7.90 | 89.92 | 10.08 | no | 6875331 | 331124 | 7.66 | 2.42 |
| Comp. Ex. 1 | 75.1 | 7.87 | 90.09 | 9.91 | no | 7141621 | 455777 | 9.91 standard | 0.00 |
| Comp. Ex. 2 | 76.1 | 8.03 | 90.03 | 9.97 | no | 7273411 | 352429 | 7.71 | 2.26 |
| Comp. Ex. 3 | 74.8 | 7.90 | 90.02 | 9.98 | yes | 7529677 | 105639 | — | — |

Example 3

An atomized powder (mean particle size: 45 μm) of In—Sn alloy (Sn: 9.6 wt. %) was introduced to DC plasma flame, to thereby synthesize an ITO ($In_2O_3$:$SnO_2$=90:10 wt. %) powder under dry conditions. The powder was collected by jetting water to the powder under wet conditions, to thereby yield an ITO powder of Example 3.

Comparative Example 4

Similar to Comparative Example 1, an indium oxide powder which had been synthesized under wet conditions was calcined at 1,000° C. Similarly, a tin oxide powder which had been synthesized under wet conditions was calcined at 1,000° C. The thus-calcined indium oxide powder (90 mass %) and tin oxide powder (10 mass %) were mixed by means of a The ITO powder of Example 3 was found to have a $SnO_2$ solid solution content of 3.00 wt. %, which is remarkably higher than the $SnO_2$ solid solution content of the ITO powder of Example 2 obtained by means of acetylene flame instead of DC plasma flame.

TABLE 2

| | ICP analysis | | | | XRD analysis | | | $SnO_2$ solid |
|---|---|---|---|---|---|---|---|---|
| | | | | | | | Precipitated | solution |
| Sample No. | In (Wt. %) | Sn (Wt. %) | $In_2O_3$ (Wt. %) | $SnO_2$ (Wt. %) | Compound oxide | $In_2O_3$ (222) | $SnO_2$ (110) | $SnO_2$ content (wt. %) | content (wt. %) |
| Ex. 3 | 73.8 | 7.46 | 90.40 | 9.60 | no | 691582 | 31090 | 6.60 | 3.00 |
| Comp. Ex. 4 | 75.1 | 7.86 | 90.10 | 9.90 | no | 892303 | 62325 | 9.90 | 0.00 |

Production Example 1

An ITO powder was synthesized in a manner similar to that employed in Example 2. The thus-synthesized ITO was calcined at 1,100° C., to thereby form an ITO powder (specific surface area: 2.97 m²/g). The powder was crushed under dry conditions by means of a ball mill, and the product was cold-pressed. After debindering, the formed ITO green compact was found to have a relative density of 53.5% with respect to the theoretical density (7.15).

The ITO green compact was fired at 1,600° C., to thereby yield a sintered sputtering target having a relative density of 99.8%.

Production Example 2

An ITO was synthesized in a manner similar to that employed in Example 1. The thus-synthesized ITO powder was calcined at 1,000° C., and the formed ITO powder was crushed under dry conditions by means of a ball mill (specific surface area of powder: 7.7 m$^2$/g). The powder was further crushed under wet conditions by means of a ball mill, to thereby form a slurry. The slurry was poured into the filtration mold. Water contained in the slurry was removed under reduced pressure from only the filter side, whereby a ITO green compact was yielded. The resultant ceramic compact was dried and debindered. The thus-debindered compact was found to have a relative density of 64.9% with respect to the theoretical density (7.15).

The ITO green compact was fired at 1,600° C., to thereby yield a sintered sputtering target having a relative density of 99.9%.

Production Example 3

An ITO was synthesized in a manner similar to that employed in Example 2. The thus-synthesized ITO was calcined at 1,050° C., to thereby yield an ITO powder (specific surface area: 4.02 m$^2$/g). The powder was crushed under dry conditions and subsequently under wet conditions by means of a ball mill, to thereby form a slurry. The slurry was poured into the filtration mold. Water contained in the slurry was removed under reduced pressure from only the filter side, whereby a ITO green compact was yielded. The resultant ceramic compact was dried and debindered. The thus-debindered compact was found to have a relative density of 65.0% with respect to the theoretical density (7.15).

The ITO green compact was fired at 1,600° C., to thereby yield a sintered sputtering target having a relative density of 99.8%.

Production Example 4

An ITO powder was synthesized in a manner similar to that employed in Example 3. The thus-synthesized ITO powder was calcined at 1,100° C., to thereby yield an ITO powder (specific surface area: 2.5 m$^2$/g). The powder was crushed under dry conditions and subsequently under wet conditions by means of a ball mill, to thereby form a slurry. The slurry was poured into the filtration mold. Water contained in the slurry was removed under reduced pressure from only the filter side, whereby a ITO green compact was yielded. The resultant ceramic compact was dried and debindered. The thus-debindered ITO green compact was found to have a relative density of 64.9% with respect to the theoretical density (7.15).

The ITO green compact was fired at 1,600° C., to thereby yield a sintered sputtering target having a relative density of 99.8%.

Comparative Production Example 1

A wet-synthesized indium oxide powder that had been produced in a manner similar to that employed in Comparative Example 1 was calcined at 1,095° C., to thereby form an indium oxide powder. Separately, a wet-synthesized tin oxide powder that had been produced in a similar manner was calcined at 1,050° C., to thereby form a tin oxide powder. The thus-formed indium oxide powder (90 mass %) and tin oxide powder (10 mass %) were mixed and crushed under dry conditions by means of a ball mill (specific surface area of powder: 4.99 m$^2$/g), and the formed powder was cold-pressed. After debindering, the obtained ITO green compact was found to have a relative density of 59.5% with respect to the theoretical density (7.15).

The ITO green compact was fired at 1,600° C., to thereby yield a sintered sputtering target having a relative density of 99.3%.

Comparative Production Example 2

A wet-synthesized indium oxide powder that had been produced in a manner similar to that employed in Comparative Example 1 was calcined at 1,095° C., to thereby form an indium oxide powder. Separately, a wet-synthesized tin oxide powder that had been produced in a similar manner was calcined at 1,050° C., to thereby form a tin oxide powder. The thus-formed indium oxide powder (90 mass %) and tin oxide powder (10 mass %) were mixed and crushed by means of a ball mill under dry conditions (specific surface area of powder: 4.99 m$^2$/g), and subsequently under wet conditions, to thereby form a slurry. The slurry was poured into the filtration mold. Water contained in the slurry was removed under reduced pressure from only the filter side, whereby a ITO green compact was yielded. The resultant ceramic compact was dried and debindered. The thus-debindered ITO green compact was found to have a relative density of 67.7% with respect to the theoretical density (7.15).

The ITO green compact was fired at 1,600° C., to thereby yield a sintered sputtering target having a relative density of 99.9%.

Test Example 3

ITO powder samples produced in the Production Examples and Comparative Production Examples were compared in terms of sinterability. Table 3 shows the results. In Table 3, sinterability is represented by the relative density of a sintered compact to that of the corresponding green compact.

As is clear from Table 3, the ITO powder of the present invention has high sinterability, thereby producing a high-density sintered compact. In addition, even when the ITO green compact does not have an increased ITO green density, a high-density sintered compact can be produced.

TABLE 3

|  | Relative density of green compact | Relative density of sintered compact | Sinterability |
| --- | --- | --- | --- |
| Prodn. Ex. 1 | 53.5% | 99.8% | 1.87 |
| Comp. Prodn. Ex. 1 | 59.5% | 99.3% | 1.67 |
| Prodn. Ex. 2 | 64.9% | 99.9% | 1.54 |
| Prodn. Ex. 3 | 65.0% | 99.8% | 1.54 |
| Prodn. Ex. 4 | 64.9% | 99.8% | 1.54 |
| Comp. Prodn. Ex. 2 | 67.7% | 99.9% | 1.48 |

Test Example 4

Sputtering targets produced in Production Examples 2 to 4 and Comparative Production Example 2 were analyzed in terms of arcing characteristics. Specifically, each target was subjected to continuous DC sputtering under the following conditions, and 50-counts life of the target was determined. The term "50-counts life" means total input electric power (Wh/cm$^2$) when the cumulative arcing count reached 50, with the exclusion of initial arcing events observed from the start of sputtering to the point in time at which the input electric power reached 10 Wh/cm$^2$. Arcing was detected by means of an arcing detection apparatus (MAM Genesis, product of Landmark Technology). The results are shown in Table 4.

As is clear from Table 4 and FIG. 9, sputtering targets produced from the ITO powder of the present invention were found to exhibit excellent arcing characteristics; i.e., to have a long target life. The target produced in Production Example 4 from an ITO powder obtained by the mediation of DC plasma flame was found to have a longer target life, as compared with the targets produced in Production Examples 2 and 3 from an ITO powder obtained by the mediation of acetylene flame.

Sputtering Conditions:
  Target dimensions: diameter 6 inches, thickness 6 mm
  Mode of sputtering: DC magnetron sputtering
  Evacuation apparatus: Rotary pump+Cryo-pump
  Vacuum attained: $3.0\times10^{-7}$ [Torr]
  Ar pressure: $3.0\times10^{-3}$ [Torr]
  Oxygen pressure: $3.0\times10^{-5}$ [Torr]
  Electric power for sputtering: 300 W (power density: 1.6 W/cm$^2$)

TABLE 4

|  | 50-Counts life (Watt · hour/cm$^2$) |
|---|---|
| Production Ex. 2 | 87 |
| Production Ex. 3 | 87 |
| Production Ex. 4 | 92 |
| Comp. Production Ex. 2 | 75 |

The invention claimed is:

1. A calcined indium oxide-tin oxide powder comprising an In—Sn oxide as a predominant component, characterized in that the oxide powder contains no compound oxide (In$_4$Sn$_3$O$_{12}$) detectable through X-ray diffraction and has a SnO$_2$ solid solution amount in In$_2$O$_3$ of 2.3 mass % or more, the SnO$_2$ solid solution amount being calculated from the ratio between integral diffraction intensity attributed to In$_2$O$_3$ (222) and integral diffraction intensity attributed to SnO$_2$ (110), and the ratio between In$_2$O$_3$ content and SnO$_2$ content obtained from an In element concentration and a Sn element concentration through ICP analysis,
  wherein the calcined indium oxide-tin oxide powder has a specific surface area of from 4 to 15 m$^2$/g.

2. An indium oxide-tin oxide powder according to claim 1, wherein the SnO$_2$ solid solution amount in In$_2$O$_3$ is 2.4 mass % or more.

3. An indium oxide-tin oxide powder according to claim 1, which has a tin content of 2.3 to 45 mass % as calculated on the basis of SnO$_2$.

4. An indium oxide-tin oxide powder according to claim 1, which is produced through feeding, into an oxidizing atmosphere serving as a heat source, an indium-tin alloy in the form of a liquid stream, liquid droplets, or powder or an ITO powder; and capturing and collecting the formed product in the form of microparticles by means of a fluid.

5. An indium oxide-tin oxide powder according to claim 4, wherein the fluid is a fluid of atomized liquid.

6. An indium oxide-tin oxide powder according to claim 4, wherein the formed microparticles flow at a maximum speed of 150 m/sec or less, when the microparticles are captured by means of the liquid fluid.

7. An indium oxide-tin oxide powder according to claim 5, wherein the formed microparticles flow at a maximum speed of 150 m/sec or less, when the microparticles are captured by means of the liquid fluid.

* * * * *